United States Patent [19]
Mine et al.

[11] Patent Number: 5,872,170
[45] Date of Patent: Feb. 16, 1999

[54] ELECTRICALLY CONDUCTIVE SILICONE ELASTOMER COMPOSITIONS, METHODS FOR MANUFACTURING SEMICONDUCTOR DEVICES, AND SEMICONDUCTOR DEVICES

[75] Inventors: Katsutoshi Mine; Osamu Mitani; Kazumi Nakayoshi; Rikako Tazawa, all of Chiba Prefecture, Japan

[73] Assignee: Dow Corning Toray Silicone Co., Ltd., Tokyo, Japan

[21] Appl. No.: 840,475

[22] Filed: Apr. 21, 1997

[30] Foreign Application Priority Data

Apr. 26, 1996 [JP] Japan .................................. 8-131435

[51] Int. Cl.⁶ .................................................... C08L 83/04
[52] U.S. Cl. ......................... 524/440; 524/588; 524/780; 524/847; 524/860; 522/99; 528/15
[58] Field of Search .............................. 522/99; 524/440, 524/588, 780, 847, 860; 528/15

[56] References Cited

U.S. PATENT DOCUMENTS 5,173,765  12/1992  Nakayoshi et al. ..................... 257/783

FOREIGN PATENT DOCUMENTS 238033    9/1987  European Pat. Off. .
653463    5/1995  European Pat. Off. .
WO 92/10543  6/1992  WIPO .

*Primary Examiner*—D. S. Nakarani
*Attorney, Agent, or Firm*—Larry A. Milco

[57] ABSTRACT

A hydrosilylation curable electrically conductive silicone elastomer composition containing an acrylic functional group-containing organopolysiloxane such that when the composition is used to adhere a semiconductor chip to a substrate and the composition is then irradiated with a high energy beam, the exposed periphery of the composition cures to the extent that migration of low molecular weight silicone species from the composition, both before and during the hydrosilyation reaction, is minimized.

A method for manufacturing a semiconductor device having improved reliability in which, during adhesion of a semiconductor chip to the substrate, package, etc., by means of this composition, decreases in wire bondability to the semiconductor chip or lead frame and adhesion defects between the semiconductor chip, substrate, package, or lead frame and the sealing resin can be inhibited.

A semiconductor device manufactured by this method which has improved reliability.

4 Claims, 2 Drawing Sheets

ELECTRICALLY CONDUCTIVE SILICONE
ELASTOMER COMPOSITIONS, METHODS
FOR MANUFACTURING SEMICONDUCTOR
DEVICES, AND SEMICONDUCTOR
DEVICES

BACKGROUND OF THE INVENTION

1. Field of the Invention

The present invention relates to electrically conductive silicone elastomer compositions, methods for manufacturing semiconductor devices, and semiconductor devices More specifically, the present invention relates to electrically conductive silicone elastomer compositions which are curable to form silicone elastomers having outstanding electrical conductivity. When the electrically conductive silicone elastomer composition is applied to a substrate and the periphery of the the composition is cured, the composition will not containminate the substrate, nor the environment in the proximity of the substrate, with low-molecular-weight silicone species prior to complete cure of the composition via a hydrosilylation reaction. The present invention also more specifically relates to methods of manufacturing semiconductor devices using the electrically conductive silicone elastomer compositions of the present invention whereby the electrically conductive silicone elastomer composition is used to adhere a semiconductor chip to a substrate, whereby the wire bondability of the semiconductor device is not adversely affected and adhesion defects between the semiconductor chip, substrate, package, or lead frame and the sealing resin can be minimized. The present invention also relates to semiconductor devices manufactured by this method which have outstanding reliability.

Electrically conductive silicone elastomer compositions which are curable to silicone elastomers are used, for example, as adhesives for adhering quartz oscillators to crystal resonators, crystal components of crystal filters, etc., and for adhering piezoelectric substrates on packages, as shielding agents for electromagnetic wave shielding, and as die bonding agents for adhering semiconductor chips to substrates, packages, etc.

When conventional electrically conductive silicone elastomer compositions are use to bond semiconductor chips to substrates, packages, etc., there are problems with wire bondability (i.e., bonding properties of the bonding wire) to the semiconductor chip or lead frame and with defects in adhesion of the semiconductor chip, substrate, package, or lead frame and the sealing resin, which causes a deterioration in the moisture resistance of the semiconductor device.

2. Description of the Related Art

In order to solve these problems, an electrically conductive silicone elastomer composition has been proposed in which the amount of volatile low-molecular-weight siloxane is reduced and curing is carried out by means of a hydrosilylation reaction (See Japanese Unexamined Patent Application No. H3-170581), but even in the case of this electrically conductive silicone elastomer composition, the decrease in wire bondability to the semiconductor chip or lead frame and the adhesion defects between the semiconductor chip, substrate, package, or lead frame and the sealing resin were not sufficiently inhibited, and the moisture resistance of the semiconductor device could not be sufficiently improved.

By means of various studies, it was confirmed that when an electrically conductive silicone elastomer composition curable by means of a hydrosilylation reaction is used to adhere a semiconductor chip to a substrate, low-molecular-weight silicone species outgas from the electrically conductive silicone elastomer. composition prior to and/or during cure of the composition via a hydrosilylation reaction. The low-molecular-weight species contaminate the surface of the semiconductor chip, substrate, package, lead frame, etc., and cause a decrease in wire bondability to the semiconductor chip or lead frame and adhesion defects between the semiconductor chip, substrate, package, or lead frame and the sealing resin. The low-molecular-weight silicone species were determined to be cyclic siloxanes contained in the organopolysiloxane which is the main component of electrically conductive silicone elastomer compositions, an organopolysiloxane for curing electrically conductive silicone elastomer compositions, or an organopolysiloxane for improving the adhesion of electrically conductive silicone elastomer compositions.

For this reason, the inventors of the present invention prepared an electrically conductive silicone elastomer composition, cured the composition at room temperature via a hydrosilylation reaction, and attempted to inhibit outgassing of low-molecular-weight silicone oil from the electrically conductive silicone elastomer composition before and during curing. The handling and workability of such an electrically conductive silicone elastomer composition were extremely poor.

Moreover, the inventors of the present invention attempted to prevent outgassing by mixing an electrically conductive filler with an acrylic functional group-containing silicone elastomer composition which was curable via a free radical reaction induced by high-energy beam irradiation. The acrylic functional group-containing silicone elastomer composition,however, did not sufficiently cure because the high-energy beam was unable to sufficiently penetrate to the inner portion of the silicone elastomer composition because of the presence of the the electrically conductive filler. The portion of the composition into which the high energy beam did not penetrate did not cure.

The present inventors conducted thorough studies on the above problems and discovered that the compositions of the present invention exhibit decreased outgassing of low-molecular-weight silicone species. Such outgassing is minimized by the use of an acrylic functional group-containing organopolysiloxane that participates in a free radical reaction when induced by a high-energy beam and by the use, in the present composition, of siloxane components which are curable via a hydrosilyation reaction.

The composition of the present invention can be used to adhere a semiconductor chip to a substrate. If the chip-composition-substrate composite is irradiatied with high energy radiation, the exposed surfaces of the composition will cure. Once the exposed surfaces are cured, the problem of low-molecular-weight silicone species contamination is minimized or eliminated. The composition is then allowed to cure via a hydrosilyation reaction to form a silicone elastomer having outstanding electrical conductivity.

The present inventors also discovered that after a semiconductor chip is mounted on a substrate or package using the composition of the present invention, and the chip-composition-substrate composite is irradiated with high-energy radiation, a free radical reaction involving the acrylic functional group-containing organopolysiloxane occurs on the surfaces of the composition which are exposed to such high-energy radiation. As a result, outgassing of low-molecular-weight silicone species from the composition is sufficiently inhibited such that the composition may be allowed to fully cure via a hydrosilylation reaction.

Specifically, the purpose of the present invention is to provide an electrically conductive silicone elastomer composition which forms a silicone elastomer having outstanding electrical conductivity in which the periphery of the electrically conductive silicone elastomer composition may be cured via irradiation with a high energy beam such that contamination by low-molecular-weight silicone oil before or during cure is averted a method for manufacturing a semiconductor device in which, during adhesion of a semiconductor chip to the substrate, package, etc., by means of this composition, decreases in wire bondability to the semiconductor chip or lead frame and adhesion defects between the semiconductor chip, substrate, package, or lead frame and the sealing resin can be inhibited; and a semiconductor device manufactured by this method which has outstanding moisture resistance.

SUMMARY OF THE INVENTION

The electrically conductive silicone elastomer composition of the present invention is characterized by being composed of (A) 100 parts by weight of an organopolysiloxane mixture consisting of
(a) 5–95% by weight of an acrylic functional group-containing organopolysiloxane having an average of at least two silicon-bonded acrylic functional groups per molecule having the formula:

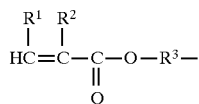

wherein $R^1$ is a hydrogen atom or a monovalent hydrocarbon group, $R^2$ is a hydrogen atom or a monovalent hydrocarbon group, and $R^3$ is a divalent hydrocarbon group having 1–10 carbon atoms; and
(b) 95–5% by weight of an alkenyl containing organopolysiloxane having an average of at least two silicon-bonded alkenyl groups per molecule;
(B) a silicon-bonded hydrogen atom-containing organopolysiloxane having an average of at least two silicon-bonded hydrogen atoms per molecule, in a sufficient quantity to provide from 0.5–20 moles of silicon-bonded hydrogen atoms in component (B) per mole of silicon-bonded alkenyl group in component (b);
(C) 50–2,000 parts by weight of an electrically conductive filler;
(D) 0.1–20 parts by weight of a photosensitizer; and
(E) a platinum-type catalyst, in an amount sufficient to cure the electrically conductive silicone composition.

The present invention also relates to an electrically conductive silicone composition, comprising;

(A') 100 parts by weight of an alkenyl group-containing organopolysiloxane having at average of least two silicon-bonded alkenyl groups per molecule;
(B') a silicon-bonded hydrogen atom-containing organopolysiloxane having an average of at least two silicon-bonded hydrogen atoms per molecule, in an amount sufficient to provide from 0.5–20 moles of silicon-bonded hydrogen atoms in component (B') per mole of silicon-bonded alkenyl group in component (A');
(C) 50–2,000 parts by weight of an electrically conductive filler;
(D) 0.1–20 parts by weight of a photosensitizer; and (E) a platinum-type catalyst, in an amount sufficient to cure the electrically conductive silicone elastomer; whereby at least one of the components selected from components (A') and (B') has an average of at least two silicon-bonded acrylic functional groups per molecule having the formula:

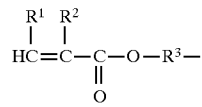

wherein $R^1$ is a hydrogen atom or a monovalent hydrocarbon group, $R^2$ is a hydrogen atom or a monovalent hydrocarbon group, and $R^3$ is a divalent hydrocarbon group having 1–10 carbon atoms.

The present invention also relates to a method for manufacturing a semiconductor device, said method comprising the steps of mounting a semiconductor chip on a substrate using the electrically conductive silicone elastomer composition of the present invention;

irradiating the composition with a high-energy beam in order to induce an acrylic functional group free radical reaction; and then curing the composition via a hydrosilylation reaction.

The present invention also relates to a semiconductor device so manufactured.

EXPLANATION OF SYMBOLS

Figure 1:
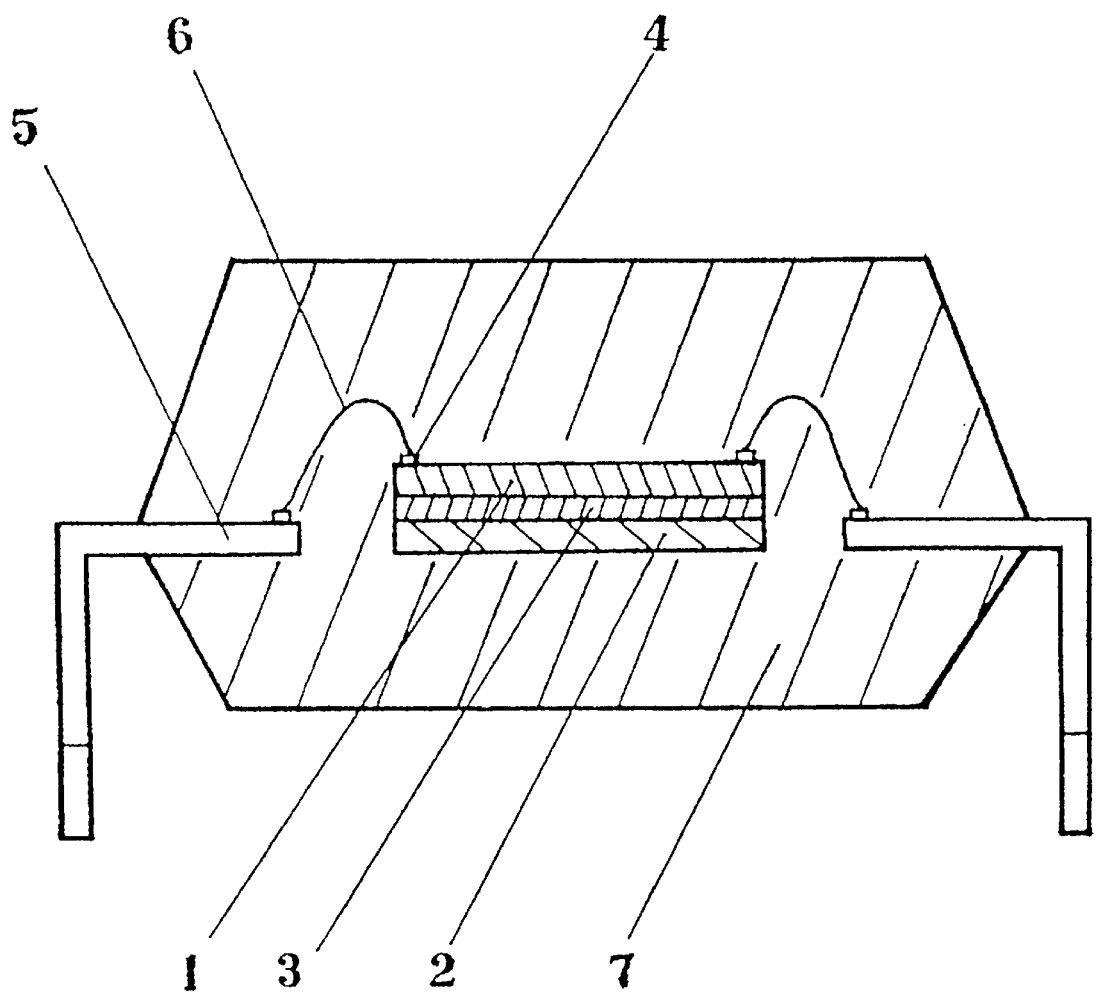
FIG. 1 is a sectional diagram of the semiconductor device used in the practical examples.

1. Semiconductor chip
2. Tab
3. Electrically conductive silicone elastomer
4. Aluminum bonding pad
5. Copper lead frame
6. Gold bonding wire
7. Epoxy sealing resin
8. Ceramic circuit board
9. Copper circuit wiring
10. Electrical components such as condensers, resistors

DETAILED DESCRIPTION OF THE INVENTION

The electrically conductive silicone elastomer composition of the present invention will first be explained in detail.

The electrically conductive silicone elastomer composition of the present invention is an electrically conductive silicone elastomer composition which is characterized by being cured. by means of an acrylic functional group free radical reaction due to a high-energy beam and a hydrosilylation reaction and is composed of (A) 100 parts by weight of an organopolysiloxane mixture comprising
(a) 5–95% by weight of an acrylic functional group-containing organopolysiloxane having an average of at least two silicon-bonded acrylic functional groups per molecule and having the formula:

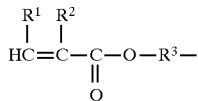

wherein $R^1$ is a hydrogen atom or a monovalent hydrocarbon group, $R^2$ is a hydrogen atom or a monovalent hydrocarbon group, and $R^3$ is a divalent hydrocarbon group having 1–10 carbon atoms; and
(b) 95–5% by weight of a silicon-bonded alkenyl group-containing organopolysiloxane having an average of at least two silicon-bonded alkenyl groups per molecule;

(B) organopolysiloxane having an average of at least two silicon-bonded hydrogen atoms per molecule, in an amount such that there are 0.5–20 moles of silicon-bonded hydrogen atoms in in component (B) per mole of silicon-bonded alkenyl groups in component (b);

(C) 50–2,000 parts by weight of an electrically conductive filler;

(D) 0.1–20 parts by weight of a photosensitizer; and (E) a platinum-type catalyst, in an amount sufficient to cure the electrically conductive silicone composition; or (A') 100 parts by weight of an alkenyl group-containing organopolysiloxane having an average of at least two silicon-bonded alkenyl groups per molecule and either having or not having silicon-bonded acrylic functional groups having the formula:

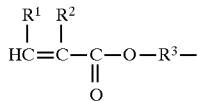

wherein $R^1$ is a hydrogen atom or a monovalent hydrocarbon group, $R^2$ is a hydrogen atom or a monovalent hydrocarbon group, and $R^3$ is a divalent hydrocarbon group having 1–10 carbon atoms;

(B') a silicon-bonded hydrogen atom-containing organopolysiloxane having an average of at least two silicon-bonded hydrogen atoms per molecule and either having or not having silicon-bonded acrylic functional groups and having the formula:

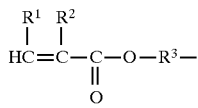

wherein $R^1$, $R^2$ and $R^3$ are as described above, in an amount such that there are 0.5–20 moles of silicon-bonded hydrogen atoms in component (B') per mole of silicon-bonded alkenyl group in component (A');

(C) 50–2,000 parts by weight of an electrically conductive filler;

(D) 0.1–20 parts by weight of a photosensitizer; and (E) a platinum-type catalyst, in an amount sufficient to cure the present composition;

wherein at least one of components (A') and (B') contains an average of at least two silicon-bonded acrylic functional groups per molecule having the formula:

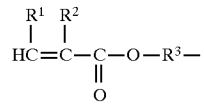

wherein $R^1$, $R^2$ and $R^3$ are as described above.

The former electrically conductive silicone elastomer composition will first be explained in detail.

Component (A) is the main ingredient of the electrically conductive silicone elastomer composition, and it is an organopolysiloxane mixture consisting essentially of (a) 5–95% by weight of an acrylic functional group-containing organopolysiloxane having an average of at least two silicon-bonded acrylic functional groups per molecule and having the formula:

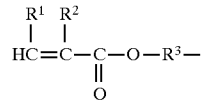

wherein $R^1$, $R^2$, and $R^3$ are described above; and (b) 95–5% by weight of an alkenyl group-containing organopolysiloxane having an average of at least two silicon-bonded alkenyl groups per molecule.

In component (A), component (a) accounts for 5–95% by weight and component (b) accounts for the remaining percent by weight, and the reason for this is that even when an electrically conductive silicone elastomer composition in which component (a) accounts for less than 5% by weight of component (A) is irradiated with a high-energy beam, the acrylic functional group free radical reaction does not occur to a sufficient degree and the purpose of the present invention cannot be achieved, and an electrically conductive silicone composition in which this amount exceeds 95% by weight will not be sufficiently cured by the hydrosilylation reaction.

Component (a) is an an acrylic functional group-containing organopolysiloxane having an average of at least two silicon-bonded acrylic functional groups per molecule and having the formula:

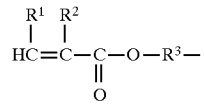

wherein $R^1$, $R^2$ and $R^3$ are described above. The reason for this is that if there are fewer than two of the above acrylic functional groups per molecule, when the electrically conductive silicone elastomer composition obtained is irradiated with a high-energy beam, the acrylic functional group free radical reaction will not occur to a sufficient degree, and the purpose of the present invention will not be achieved. In preferred embodiments, $R^1$ is selected from the group consisting of alkyl, alkenyl, aryl, and aralky. In more preferred embodiments, $R^1$ is selected from the group consisting of methyl, ethyl, propyl, vinyl, allyl, phenyl, tolyl, xylyl, benzyl and phenylethyl. In preferred embodiments, $R^2$ is selected from the group consisting of alkyl, alkenyl, aryl and aralky. In more preferred, embodiments $R^2$ is selected from the group consisting of methyl, ethyl, propyl, vinyl, allyl, phenyl, tolyl, xylyl, benzyl and phenylethyl. In preferred embodiments, $R^3$ is selected from the group consisting of methylene, ethylene, propylene, butylene, and pentylene. In more preferred embodiments, $R^3$ is propylene. Preferred acrylic functional groups include 3-acryloxypropyl, 4-acryloxypropyl, and 3-methacryloxypropyl. The more preferred acrylic functional group is 3-methacryloxypropyl. Example of the bonding position of this acrylic functional group include the molecular chain terminal and the molecular chain side chain, with the molecular chain terminal being preferred because reactivity is favorable. Examples of other groups which bond to the silicon atoms in component (a) include substituted or unsubstituted monovalent hydrocarbon groups, including alkyl groups such as methyl, ethyl, propyl, butyl, pentyl, hexyl, heptyl, octyl, nonyl, decyl, or octadecyl; cycloalkyl groups such as cyclopentyl group or cyclohexyl; alkenyl groups such as a vinyl, allyl, butenyl, pentenyl, hexenyl, or heptenyl; aryl groups such as phenyl, tolyl, xylyl, or naphthyl; aralkyl groups such as benzyl, phenylethyl, or phenylpropyl; or halogenated alkyl groups such as 3-chloropropyl or 3,3,3-trifluoropropyl; alkoxy groups such as methoxy, ethoxy, propoxy, butoxy, methoxymethoxy, or methoxyethoxy; a hydroxyl; or a hydrogen atom; with a methyl group or phenyl group being preferred. Examples of the molecular structure of component (a) include the straight-chain type, partially-branched straight-chain type, branched-chain type, cyclic type, and network type, with the straight-chain type being preferred. Moreover, concerning the viscosity of component (a) at 25° C., the range of 20–200,000 mPa.s is preferred because. the physical properties of the electrically conductive silicone elastomer obtained, such as flexibility and elongation, are favorable, and because the handling and workability of the electrically conductive silicone elastomer composition are favorable. A range of 500–20,000 mPa.s is particularly preferred.

Examples of this component (a) include methylvinylpolysiloxane having both terminals of the molecule terminated with 3-methacryloxypropyl dimethoxysiloxy groups, dimethylsiloxane.methylvinylailoxane copolymer having both terminals of the molecule terminated with 3-methacryloxypropyl dimethoxysiloxy groups, methylvinylpolysiloxane having both terminals of the molecule terminated with 3-methacryloxypropyl diethoxysiloxy groups, dimethylsiloxane.methylvinylsiloxane copolymer having both terminals of the molecule terminated with 3-methacryloxypropyl diethoxysiloxy groups, methylvinylsiloxane.methyl(trimethoxysilylethyl) siloxane.methyl(3-methacryloxypropyl)siloxane copolymer having both terminals of the molecule terminated with trimethylsiloxy groups, dimethylsiloxane.methylvinylsiloxane.methyl(trimethoxysilylethyl)siloxane.methyl(3-methacryloxypropyl)siloxane copolymer having both terminals of the molecule terminated with trimethylsiloxy groups, methylvinylpolysiloxane having both terminals of the molecule terminated with 3-acryloxypropyl dimethoxysiloxy groups, dimethylsiloxane.methylvinylsiloxane copolymer having both terminals of the molecule terminated with 3-acryloxypropyl dimethoxysiloxy groups, methylvinylpolysiloxane having both terminals of the molecule terminated with 3-acryloxypropyl diethoxysiloxy groups, dimethylsiloxane.methylvinylsiloxane copolymer having both terminals of the molecule terminated with 3-acryloxypropyl diethoxysiloxy groups, methylvinylsiloxane.methyl(trimethoxysilylethyl)siloxane.methyl(3-acryloxypropyl)siloxane copolymer having both terminals of the molecule terminated with trimethylsiloxy groups, dimethylsiloxane.methylvinylsiloxane.methyl(trimethoxysilylethyl) siloxane.methyl(3-acryloxypropyl) siloxane copolymer having both terminals of the molecule terminated with trimethylsiloxy groups, organopolysiloxane composed of $CH_2=CHCOOC_3H_6$ $(CH_3O)_2SiO_{1/2}$ and $SiO_{4/2}$ units, organopolysiloxane composed of $(CH_3)_3SiO_{1/2}$, $CH_2=CHCOOC_3H_6(CH_3O)_2SiO_{1/2}$, and $SiO_{4/2}$ units, organopolysiloxane composed of $(CH_3)_3SiO_{1/2}$, $CH_3=CHCOOC_3H_6(CH_3O)_2SiO_{1/2}$, $(CH_3)_2SiO_{2/2}$, and $SiO_{4/2}$ units, organopolysiloxane composed of $CH_2=CH(CH_3)COOCH_3H_6(CH_3O)_2SiO_{1/2}$ and $SiO_{4/2}$ units, organopolysiloxane composed of $(CH_3)_3SiO_{1/2}$, $CH_2=CH(CH_3)COOC_3H_6(CH_3O)_2SiO_{1/2}$, and $SiO_{4/2}$ units, organopolysiloxane composed of $(CH_3)_3SiO_{1/2}$, $CH_2=CH(CH_3)COOC_3H_6(CH_3O)_2SiO_{1/2}$, $(CH_3)_2SiO_{2/2}$, and $SiO_{4/2}$ units and mixtures of two or more types of these organopolysiloxanes.

Component (b) is an alkenyl group-containing organopolysiloxane having an average of at least two silicon-bonded alkenyl groups per molecule. The reason for this is that if there are fewer than two silicon-bonded alkenyl groups per molecule, the electrically conductive silicone elastomer composition obtained will not sufficiently cure via a hydrosilylation reaction, making it unsuitable as a die bonding agent. Examples of the bonding sites of these alkenyl groups are the molecular. chain terminal and molecular chain side chain, with the molecular chain terminal being preferred because of favorable reactivity. Examples of these alkenyl groups include vinyl, allyl, butenyl, pentenyl, hexenyl, and heptenyl groups, with a vinyl group being preferred. Moreover, examples of other groups which bond to the silicon atom in component (b) include substituted or unsubstituted monovalent hydrocarbon groups, including, but not limited to, alkyl groups such as methyl, ethyl, propyl, butyl, pentyl, hexyl, heptyl, octyl, nonyl, decyl, or octadecyl; cycloalkyl groups such as cyclopentyl group or cyclohexyl; aryl groups such as phenyl, tolyl, xylyl, or naphthyl; aralkyl groups such as benzyl, phenylethyl, or phenylpropyl; halogenated alkyl groups such as 3-chloropropyl or 3,3,3-trifluoropropyl; alkoxy groups such as methoxy, ethoxy, propoxy, butoxy, methoxymethoxy, or methoxyethoxy; and a hydroxyl, with a methyl group or phenyl group being preferred. Examples of the molecular structure of component (b) include the straight-chain type, partially-branched straight-chain type, branched type, cyclic type, and network type, with the straightchain type being preferred. Moreover, concerning the viscosity of component (b) at 25° C., a range of 20–200,000 mPa.s is preferred because the physical properties of the electrically conductive silicone elastomer obtained, such as flexibility and elongation, are favorable, and because the handling and workability of the electrically conductive silicone elastomer composition obtained are favorable. A range of 500–20,000 mPa.s is particularly preferred.

Examples of this component (b) include dimethylsiloxane.methylvinylsiloxane copolymer having both terminals of the molecule terminated with trimethylsiloxy groups, methylvinylpolysiloxane having both terminals of the molecule terminated with trimethylsiloxy groups, dimethylsiloxane.methylvinylsiloxane.methylphenylsiloxane copolymer having both terminals of the molecule terminated with trimethylsiloxy groups, dimethylpolysiloxane having both terminals of the molecule terminated with dimethylvinylsiloxy groups, dimethylsiloxane.methylvinylsiloxane copolymer having both terminals of the molecule terminated with dimethylvinylsiloxy groups, dimethylsiloxane.methylvinylsiloxane.methylphenylsiloxane copolymer having both terminals of the molecule terminated with dimethylvinylsiloxy groups, organopolysiloxane composed of $(CH_2=CH)(CH_3)_2SiO_{1/2}$ and $SiO_{4/2}$ units, organopolysiloxane composed of $(CH_3)_3SiO_{1/2}$, $(CH_2=CH)(CH_3)SiO_{1/2}$, and $SiO_{4/2}$ units, organopolysiloxane composed of $(CH_3)_3SiO_{1/2}$, $(CH_2=CH)(CH_3)_2SiO_{1/2}$, $(CH_3)_2SiO_{2/2}$, and $SiO_{4/2}$ units, and mixtures of two or more kinds of these organopolysiloxanes.

Component (B) is the component for curing the former electrically conductive silicone elastomer composition, and it is a silicon-bonded hydrogen atom-containing organopolysiloxane having an average of at least two silicon-bonded hydrogen atoms per molecule. The reason for this is that if there are fewer than two silicon-bonded hydrogen atoms per molecule, the electrically conductive silicone elastomer composition obtained will not be sufficiently cured by the hydrosilylation reaction, making it unsuitable as a die bonding agent. Examples of the bonding position of this hydrogen atom are the molecular chain terminal and the molecular chain side chain. Examples of other groups which bond to the silicon atoms in component (B) include substituted or unsubstituted monovalent hydrocarbon groups, including alkyl groups such as methyl, ethyl, propyl, butyl, pentyl, hexyl, heptyl, octyl, nonyl, decyl, or octadecyl; cycloalkyl groups such as cyclopentyl group or cyclohexyl; aryl groups such as phenyl, tolyl, xylyl, or naphthyl; aralkyl groups such as benzyl, phenylethyl, or phenylpropyl; and halogenated alkyl groups such as 3-chloropropyl group or 3,3,3-trifluoropropyl; alkoxy groups such as methoxy, ethoxy, propoxy, butoxy, methoxymethoxy, or methoxyethoxy; and a hydroxyl, with a methyl group or phenyl group being preferred. Examples of the molecular structure of component (B) are the straight-chain type, partially-branched straight-chain type, branched-chain type, cyclic type, and network type, with the straight-chain type being preferred. Moreover, concerning the viscosity of component (B) at 25° C., a range of 1–50,000 mPa.s is preferred because the composition of the electrically conductive silicone elastomer composition is stable and its handling and workability are favorable. A range of 5–1,000 mPa.s is particularly preferred.

Examples of this component (B) include methylhydrogenpolysiloxane having both terminals of the molecule terminated with trimethylailoxy groups, dimethylsiloxane.methylhydrogensiloxane copolymer having both terminals of the molecule terminated with trimethylsiloxy groups, dimethylpolysiloxane having both terminals of the molecule terminated with dimethylhydrogensiloxy groups, dimethylsiloxane.methylhydrogensiloxane copolymer having both terminals of the molecule terminated with dimethylhydrogensiloxy groups, organopolysiloxane composed of $(CH_3)_2HSiO_{1/2}$ and $SiO_{4/2}$ units, organopolysiloxane composed of $(CH_3)_3SiO_{1/2}$, $(CH_3)_2HSiO_{1/2}$, and $SiO_{4/2}$ units, organopolysiloxane composed of $(CH_3)_3SiO_{1/2}$, $(CH_3)_2HSiO_{1/2}$, $(CH_3)_2SiO_{2/2}$, and $SiO_{4/2}$ units, and mixtures of two or more kinds of these organopolysiloxanes.

The amount of component (B) used in the composition of the present invention is an amount such that there are 0.5–20 moles of silicon-bonded hydrogen atoms in component (B) per mole of silicon-bonded alkenyl group in component (b). The reason for this is that electrically conductive silicone elastomer compositions in which the amount of silicon-bonded hydrogen atoms in component (B) is less than 0.5 moles per mole of silicon-bonded alkenyl group in component (b) will not cure sufficiently via a hydrosilylation reaction, making them unsuitable as die bonding agents, and electrically conductive silicone elastomer compositions in which this amount exceeds 20 moles form bubbles, etc., during curing.

Component (C) is an electrically conductive filler for imparting outstanding electrical conductivity to the electrically conductive silicone elastomer obtained by curing the former electrically conductive silicone elastomer composition. Examples of this component (C) include metal fine powders such as gold, silver, nickel, and copper; and plated fine powders in which metals such as gold, silver, nickel, and copper are vapor-deposited on the surface of fine powders such as ceramics, glass, quartz, and organic resins. In this electrically conductive silicone elastomer composition, in order to obtain high-electrical-conductivity silicone elastomer in which volume resistivity is 0.1 Ω·cm or less, component (C) should preferably be a gold fine powder or silver fine powder, with a silver fine powder being preferred for practical use. Examples of the shape of this silver fine powder are the spherical type, flake type, and flake-branch type. The flake type or flake-branch type of this silver fine powder is particularly preferred in order to obtain a high-electrical-conductivity silicone elastomer having volume resistivity of $1 \times 10^{-3}$ Ω·cm or less, and a mixture of flake-type silver fine powder and flake-branch type silver fine powder is particularly preferred. In this case, the weight ratio of the flake type silver fine powder to the flake-branch type silver fine powder should preferably be 80/20–20/80. Moreover, the average particle diameter of this silver fine powder should preferably be 1–10 μm.

The amount of component (C) in the mixture is 50–2,000 parts by weight with respect to 100 parts by weight of component (A), with 300–1,000 parts by weight being preferred. The reason for this is that if the amount of component (C) is less than 50 parts by weight with respect to 100 parts by weight of component (A), it is not possible to impart sufficient electrical conductivity to the silicone elastomer obtained, and if it exceeds 2000 parts by weight, the handling and workability of the electrically conductive silicone elastomer composition obtained will markedly deteriorate.

Component (D) is a photosensitizer for promoting the free radical reaction due to the acrylic functional groups in component (a) when the former electrically conductive silicone elastomer composition is irradiated with a high-energy beam. Examples of this component (D) include acetophenones such as acetophenone, dichloroacetophenone, trichloro acetophenone, tert-butyltrichloroacetophenone, 2,2-diethoxyacetophenone, and p-dimethylaminoacetophenone and derivatives thereof; benzoins such as benzoinmethyl ether, benzoinethyl ether, benzoinisobutyl ether, and benzoinbutyl ether and derivatives thereof; benzophenones such as benzophenone, 2-chlorobenzophenone, p,p'-dichlorobenzophenone, and p,p'-bisdiethylaminobenzophenone and derivatives thereof; and p-dimethylaminopropiophenone, hydroxyisobutylphenone, Michler's ketone, benzyl, benzyldimethyl ketal, tetramethyl thiuram monosulfide, thioxanthone, 2-chlorothioxanthone, 2-methylthioxanthone, azoisobutyronitrile, benzoisoperoxide, di-tert-butylperoxide, 1-hydroxychlorohexylphenyl ketone, 2-hydroxy-2-methyl-1-phenylpropan-1-one, 1-(4-isopropylphenyl)-2-hydroxy-2-methylpropan-1-one, methylbenzoylformate, diphenylsulfide, anthracene, 1-chloroanthraquinone, diphenyldisulfide, diacetyl, hexachlorobutadiene, pentachlorobutadiene, octachlorobutadiene, 1-chloromethylnaphthalene, and mixtures of two or more kinds of these photosensitizers, with acetophenone, benzoin, benzophenone, and derivatives thereof being preferred. The amount of component (D) in the mixture is 1–20 parts by weight with respect to 100 parts by weight of component (A), with 5–15 parts by weight being particularly preferred. The reason for this is that if the amount of component (D) is less than 1 part by weight with respect to 100 parts by weight of component (A), even when the electrically conductive silicone elastomer composition obtained is irradiated with a high-energy beam, the free radical reaction due to the acrylic functional groups will become difficult to produce, making it impossible to achieve the purpose of the present invention. If the amount of component (D) exceeds 20 parts by weight, the resulting electrically conductive silicone elastomer composition will exhibit porr storage stability as well as poor handling and workability properties.

Component (E) is a platinum-type catalyst for promoting the hydrosilylation reaction of the electrically conductive silicone elastomer composition of the present invention. Examples of this component (E) include platinum black, platinum-carrying activated charcoal, platinum-carrying silica fine powder, chloroplatinic acid, alcohol solution of chloroplatinic acid, complexes of platinum and olefins, complexes of platinum and vinylsiloxane, and fine-particle catalysts composed of thermoplastic resins containing these platinum-type catalysts. Examples of these thermoplastic resins include silicone resin, polycarbonate resin, acrylic resin, nylon resin, and polyester resin. Moreover, the softening point of this thermoplastic resin should preferably be 5°–20° C., and its particle diameter should preferably be 0.01–10 μm.

The amount of component (E) in the mixture is an amount sufficient to cure the electrically conductive silicone elastomer composition of the present invention. The preferred amount of component (E) is an amount such that the amount of platinum metal in the composition of the present invention is 0.1–1,000 ppm, with 0.5–500 ppm being particularly preferred.

Next, the latter electrically conductive silicone elastomer composition will be explained in detail.

Component (A') is the main ingredient of the latter electrically conductive silicone elastomer composition. It is a silicon-bonded alkenyl group-containing organopolysiloxane having an average of at least two alkenyl groups per molecule.

In one embodiment of the present invention, component (A') may contain silicon-bonded acrylic functional groups having the formula:

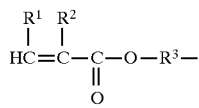

wherein $R^1$ is a hydrogen atom or a monovalent hydrocarbon, $R^2$ is a hydrogen atom or a monovalent hydrocarbon group, and $R^3$ is a divalent hydrocarbon group having 1–10 carbon atoms. In another embodiment of the present invention, component (A') may be free of such silicon-bonded acrylic functional groups.

If component (A') contains an average of less than two silicon-bonded alkenyl groups per molecule, the resulting electrically conductive silicone elastomer composition will not properly cure via a hydrosilylation reaction, making it unsuitable as a die bonding agent.

In preferred embodiments, the silicon-bonded alkenyl groups of component (A') are selected from the group consisting of vinyl, allyl, butenyl, pentenyl, hexenyl, or heptenyl. Vinyl is particularly preferred. The silicon-bonded alkenyl group of component (A') may be located on the molecular chain terminal or the molecular chain side chain or both.

In preferred embodiments, any silicon-bonded organic group, other than the silicon-bonded alkenyl groups, in component (A') is selected from the group consisting of alkyl, cycloalkyl, aryl, aralkyl, halogenated alkyl, alkoxy and hydroxyl groups.

Preferred alkyl groups are selected from the group consisting of methyl, ethyl, propyl, butyl, pentyl, hexyl, heptyl, octyl, nonyl, decyl, and octadecyl. Preferred cycloalkyl groups are selected from the group consisting of cyclopentyl and cyclohexyl. Preferred aryl groups are selected from the group consisting of phenyl, tolyl, xylyl, and naphthyl. Preferred aralkyl. groups are selected from the group consisting of benzyl, phenylethyl, and phenylpropyl. Preferred halogenated alkyl groups are selected from the group consisting of 3-chloropropyl, and 3,3,3-trifluoropropyl. Preferred alkoxy groups are selected from the group consisting of methoxy, ethoxy, propoxy, butoxy, methoxymethoxy and ethoxyethoxy group. Particularly preferred groups are methyl and phenyl.

When component (B') is free of silicon-bonded acrylic functional groups having the formula listed below or contains an average of less than two silicon-bonded acrylic functional groups per molecule having the formula below,

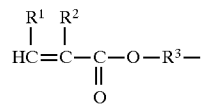

wherein $R^1$, $R^2$, and $R^3$ are described above; component (A') must contain an average of at least two silicon-bonded acrylic functional groups per molecule having the above formula. If neither component (A') nor component (B') contains an average of at least two silicon-bonded acrylic functional groups per molecule having the above formula, then when the resulting formulation is irradiated with a high-energy beam, the acrylic functional group free radical reaction will not be induced to a significant degree.

Examples of the molecular structure of component (A') include the straight-chain type, partially-branched straight-chain type, branched-chain type, cyclic type, and network type. The viscosity of component (A') at 25° C. should preferably be in the range of 20–200,000 mPa.s as the physical properties of the electrically conductive silicone elastomer obtained, such as flexibility and elongation, are favorable, and because the handling and workability of the electrically conductive silicone elastomer composition obtained are favorable. A range of 500–20,000 mPa.s is particularly preferred.

Examples of this component (A') include organopolysiloxanes such as the aforementioned component (b), and examples of silicon-bonded acrylic functional group-containing organopolysiloxanes such as methylvinylpolysiloxane having both terminals of the molecule terminated with 3-methacryloxypropyl dimethoxysiloxy groups, dimethylsiloxane.methylvinylsiloxane copolymer having both terminals of the molecule terminated with 3-methacryloxypropyl dimethoxysiloxy groups, methylvinylpolysiloxane having both terminals of the molecule terminated with 3-methacryloxypropyl diethoxysiloxy groups, dimethylsiloxane.methylvinylsiloxane copolymer having both terminals of the molecule terminated with 3-methacryloxypropyl diethoxysiloxy groups, methylvinylsiloxane.methyl(trimethoxysilylethyl) siloxane.methyl(3-methacryloxypropyl)siloxane copolymer having both terminals of the molecule terminated with trimethylsiloxy groups, dimethylsiloxane.methylvinylsiloxane.methyl (trimethoxysilylethyl)siloxane.methyl(3-methacryloxypropyl)siloxane copolymer having both terminals of the molecule terminated with trimethylsiloxy groups, methylvinylpolysiloxane having both terminals of the molecule terminated with 3-acryloxypropyl dimethoxysiloxy groups, dimethylsiloxane.methylvinylsiloxane copolymer having both terminals of the molecule terminated with 3-acryloxypropyl dimethoxysiloxy groups, methylvinylpolysiloxane having both terminals of the molecule terminated with 3-acryloxypropyl diethoxysiloxy groups, dimethylsiloxane.methylvinylsiloxane copolymer having both terminals of the molecule terminated with 3-acryloxypropyl diethoxysiloxy groups, methylvinylsiloxane.methyl (trimethoxysilylethyl)siloxane.methyl(3-acryloxypropyl) siloxane copolymer having both terminals of the molecule terminated with trimethylsiloxy groups, dimethylsiloxane.methylvinylsiloxane.methyl (trimethoxysilylethyl)siloxane.methyl(3-acryloxypropyl) siloxane copolymer having both terminals of the molecule terminated with trimethylsiloxy groups, and mixtures of two or more types of these organopolysiloxanes.

An example of a method for preparing an alkenyl group-containing organopolysiloxane having an average of at least two silicon-bonded alkenyl groups per molecule and at least two of the aforementioned silicon-bonded acrylic functional groups per molecule is a method in which an a silicon-bonded alkenyl group-containing organopolysiloxane having an average of at least two silicon-bonded alkenyl groups per molecule and an average of at least two silicon-bonded hydrogen altoms per molecule is subjected to a condensation reaction with an organic silicon compound having the aforementioned silicon-bonded acrylic functional group and a silicon-bonded alkoxy group. Examples of such an a silicon-bonded alkenyl group-containing organopolysiloxane having an average of at least two silicon-bonded alkenyl groups per molecule and an average of at least two silicon-bonded hydrogen atoms per molecule include methylvinylpolysiloxane having both terminals of the molecule terminated with silanol groups and dimethylsiloxane.methylvinylsiloxane copolymer having both terminals of the molecule terminated with silanol groups. Moreover, examples of an organic silicon compound having the aforementioned silicon-bonded acrylic functional group and a silicon-bonded alkoxy group include 3-acryloxypropyltrimethoxysilane, 3-acryloxypropyl dimethylmethoxysilane, 3-acryloxymethylbis(trimethylsiloxy)silane, 3-methacryloxypropenyltrimethoxysilane, 3-methacryloxypropyl dimethylethoxysilane, 3-methacryloxypropylmethyldiethoxysilane, and 3-methacryloxypropyltris(methoxyethoxy)silane. In this condensation reaction, a commonly-known condensation reaction catalyst may also be used.

Component (B') is a component for curing the latter electrically conductive silicone elastomer composition, and it is a silicon-bonded hydrogen atom-containing organopolysiloxane which has an average of at least two silicon-bonded hydrogen atoms per molecule. Component (B') may contain a silicon-bonded acrylic functional group having the formula:

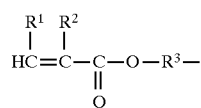

wherein $R^1$, $R^2$, and $R^3$ are described above. Component (B') may also be free of such silicon-bonded acrylic functional groups.

Component (B') must have an average of at least two silicon-bonded hydrogen atoms per molecule, and the reason for this is that if there are fewer than two silicon-bonded hydrogen atoms per molecule, the electrically conductive silicone elastomer composition obtained will not be sufficiently cured due to the hydrosilylation reaction, making it unsuitable as a die bonding agent. Examples of the bonding position of this hydrogen atom are the molecule chain terminal and molecular chain side chain. Moreover, examples of other groups which bond to the silicon atoms in component (B') include alkyl groups such as methyl, ethyl, propyl, butyl, pentyl, hexyl, heptyl, octyl, nonyl, decyl, or octadecyl; cycloalkyl groups such as cyclopentyl group or cyclohexyl; aryl groups such as phenyl, tolyl, xylyl, or naphthyl; aralkyl groups such as benzyl, phenethyl, or phenylpropyl; halogenated alkyl groups such as 3-chloropropyl group or 3,3,3-trifluoropropyl; alkoxy groups such as methoxy, ethoxy, propoxy, butoxy, methoxymethoxy, or ethoxyethoxy; and hydroxyl groups, with a methyl group or phenyl group being preferred. Moreover, in cases where component (A') contains only one silicon-bonded acrylic functional group per molecule having the formula:

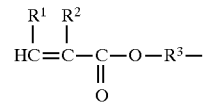

wherein $R^1$, $R^2$, and $R^3$ are described above; or does not contain this acrylic functional group at all, it is necessary for component (B') to have an average of at least two silicon-bonded acrylic functional groups per molecule having the formula:

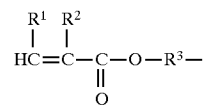

wherein $R^1$, $R^2$, and $R^3$ are described above.

Examples of the molecular structure of component (B') include the straight-chain type, partially-branched straight-chain type, branched-chain type, cyclic type, and network type. The viscosity of component (B') at 25° C. should preferably be in the range of 1–50,000 mPa.s so that the resulting composition is storage stable and its handling and workability properties will be favorable. A range of 5–1,000 mPa.s is particularly preferred.

Examples of siloxanes which may be used a component (B') includes, but are not limited to, those organopolysiloxanes mentioned as examples of component (B), and silicon-bonded acrylic functional group-containing organopolysiloxanes.

When component (B') is a silicon-bonded acrylic functional group-containing organopolysiloxane it is preferably selected from the group consisitng of methylhydrogenpolylsiloxane having both terminals of the molecule terminated with 3-methacryloxypropyl dimethoxysiloxy groups, dimethylsiloxane.methylhydrogensiloxane copolymer having both terminals of the molecule terminated with 3-methacryloxypropyl dimethoxysiloxy groups, methylhydrogenpolylsiloxane having both terminals of the molecule terminated with 3-methacryloxypropyl diethoxysiloxy groups, dimethylsiloxane.methylhydrogensiloxane copolymer having both terminals of the molecule terminated with 3-methacryloxypropyl diethoxysiloxy groups, methylhydrogensiloxane.methyl(trimethoxysilylethyl) siloxane.methyl(3-methacryloxypropyl)siloxane copolymer having both terminals of the molecule terminated with trimethylsiloxy groups, dimethylsiloxane.methylhydrogensiloxane.methyl (trimethoxysilylethyl)siloxane.methyl(3-methacryloxypropyl)siloxane copolymer having both terminals of the molecule terminated with trimethylsiloxy groups, methylhydrogenpolylsiloxane having both terminals of the molecule terminated with 3-acryloxypropyl dimethoxysiloxy groups, dimethylsiloxane.methylhydrogensiloxane copolymer having both terminals of the molecule terminated with 3-acryloxypropyl dimethoxysiloxy groups, methylhydrogenpolylsiloxane having both terminals of the molecule terminated with 3-acryloxypropyl diethoxysiloxy groups, dimethylsiloxane.methylhydrogensiloxane copolymer having both terminals of the molecule terminated with 3-acryloxypropyl diethoxysiloxy groups, methylhydrogensiloxane.methyl(trimethoxysilylethyl) siloxane.methyl(3-acryloxypropyl)siloxane copolymer having both terminals of the molecule terminated with trimethylsiloxy groups, dimethylsiloxane.methylhydrogensiloxane.methyl (trimethoxysilylethyl)siloxane.methyl(3-acryloxypropyl) siloxane copolymer having both terminals of the molecule terminated with trimethylsiloxy groups, and mixtures of two or more kinds of these organopolysiloxanes.

An example of a method for manufacturing an a silicon-bonded hydrogen atom-containing organopolysiloxane having an average of at least two silicon-bonded hydrogen atoms per molecule and an average of at least two of the aforementioned silicon-bonded acrylic functional groups per molecule is a method in which an organopolysiloxane, having an average of at least two silicon-bonded hydrogen atoms per molecule and an average of at least two silicon-bonded hydroxyl groups per molecule; and an organic silicon compound having the aforementioned silicon-bonded acrylic functional group and a silicon-bonded alkoxy group are subjected to a condensation reaction. Examples of this organopolysiloxane which has an average of at least two silicon-bonded hydrogen atoms per molecule and an average of at least two silicon-bonded hydroxyl groups per molecule include methylhydrogenpolylsiloxane having both terminals of the molecule terminated with silanol groups and dimethylsiloxane.methylhydrogensiloxane copolymer having both terminals of the molecule terminated with silanol groups.

Moreover, examples of organic silicon compounds having the aforementioned silicon-bonded acrylic functional group an silicon-bonded alkoxy groups include 3-acryloxypropyl trimethoxysilane, 3-acryloxypropyl dimethylmethoxysilane, 3-acryloxymethylbis(trimethylsiloxy)silane, 3-methacryloxypropenyl trimethoxysilane, 3-methacryloxypropyl dimethylethoxysilane, 3-methacryloxypropyl methyldiethoxysilane, and 3-methacryloxypropyl tris(methoxyethoxy)silane. In this condensation reaction, a commonly-known condensation reaction catalyst may also be used. Another example is a method in which an organic compound having an alkenyl group and the aforementioned acrylic functional group is subjected to a hydrosilylation reaction with an organopolysiloxane having at least three silicon-bonded hydrogen atoms per molecule in the presence of a platinum-type catalyst. Examples of organic compounds which have this alkenyl group and the aforementioned acrylic functional group include allyl methacrylate and 3-methacryloxypropyl dimethyl(vinyldimethylsiloxy)silane. Examples of platinum-type catalysts which may be used in this hydrosilylation reaction are the same catalysts as those specified for component (D) above.

The amount of component (B') in the composition of the present invention is an amount such that the silicon-bonded hydrogen atoms in component (B') are present in the amount of 0.5–20 moles per mole of silicon-bonded alkenyl group in component (A'). The reason for this is that if the amount of silicon-bonded hydrogen atoms in component (B') is less than 0.5 moles per mole of the silicon-bonded alkenyl group in component (A'), the resulting electrically conductive silicone elastomer composition will not cure properly and will be unsuitable as use as a die bonding agent. If the amount of silicon-bonded hydrogen atoms in component (B') is greater than 20 moles per mole of silicon-bonded alkenyl group in component (A'), the resulting electrically conductive silicone elastomer composition will form bubbles during cure.

Component (C) is an electrically conductive filler for imparting outstanding electrical conductivity to the electrically conductive silicone elastomer obtained by curing the latter electrically conductive silicone elastomer composition, and examples thereof are the same as for the aforementioned electrically conductive filler. In this electrically conductive silicone elastomer composition, in order to obtain a high-electrical-conductivity silicone elastomer having a volume resistivity of 0.1 $\Omega$·cm or less, gold fine powder or silver fine powder should preferably be used as component (C), with silver fine powder being preferred for practical use. Examples of the shape of this silver fine powder include the spherical type, flake type, and flake-branch type. In particular, in order to obtain high-electrical-conductivity silicone elastomer having a volume resistivity of $1 \times 10^{-3}$ $\Omega$·cm or less, it is preferable if the shape of this silver fine powder is of the flake type or flake-branch type, with a mixture of silver fine powder of the flake type and silver fine powder of the flake-branch type being particularly preferred. In this case, the ratio of the weight of the flake type silver fine powder to the flake-branch type silver fine powder should preferably be 80/20–20/80. Moreover, the average particle size of this silver fine powder should preferably be 1–10 $\mu$m. The amount of component (C) in the mixture is 50–2,000 parts by weight with respect to 100 parts by weight of component (A'). A range of 300–1,000 parts by weight being preferred. The reason for this is that if the amount of component (C) is less than 50 parts by weight with respect to 100 parts by weight of component (A'), it will not be possible to impart sufficient electrical conductivity to the silicone elastomer obtained, and if it exceeds 2,000 parts by weight, there will be marked deterioration of the handling and workability of the electrically conductive silicone elastomer composition obtained.

Component (D) is a photosensitizer for promoting the free radical reaction due to the acrylic functional groups in component (A') and/or component (B') when the electrically conductive silicone elastomer composition obtained is irradiated with a high-energy beam, and examples include the same photosensitizers as those specified above, with acetophenone, benzoin, benzophenone, and derivatives thereof being preferred. The amount of component (D) in the mixture is 0.1–20 parts by weight with respect to 100 parts by weight of component (A'), with 5–15 parts by weight being particularly preferred. The reason for this is that if the amount of component (D) is less than 0.1 part by weight with respect to 100 parts by weight of component (A'), even when the electrically conductive silicone elastomer composition obtained is irradiated with a high-energy beam, the free radical reaction due to the acrylic functional groups will not tend to occur and the purpose of the present invention cannot be achieved, and electrically conductive silicone elastomer compositions in which it exceeds 20 parts by weight will show deterioration of storage stability, etc., resulting in a deterioration of handling and workability.

Component (E) is a platinum-type catalyst for promoting the hydrosilylation reaction of the latter electrically conductive silicone elastomer composition, and examples thereof are the same platinum-type catalysts as those specified above. The amount of component (E) in the mixture is an amount sufficient to cure the latter electrically conductive silicone elastomer composition, and specifically, in the latter electrically conductive silicone elastomer composition, it should be present in an amount such that the platinum metal content in component (E) is 0.01–1,000 ppm in units by weight, with an amount such that it is 0.5–500 ppm being particularly preferred.

Adhesion-promoting agents may also be mixed in with these electrically conductive silicone elastomer compositions as additional optional components, including alkoxysilanes such as tetramethoxysilane, tetraethoxysilane, dimethyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane; organopolysiloxanes having the following formula:

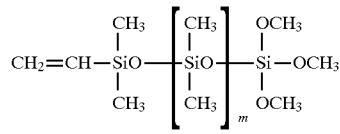

wherein m is a positive number, an organopolysiloxane having the following formula:

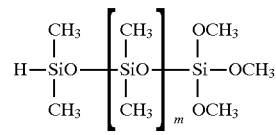

wherein m is a positive number, an organopolysiloxane having the following general formula:

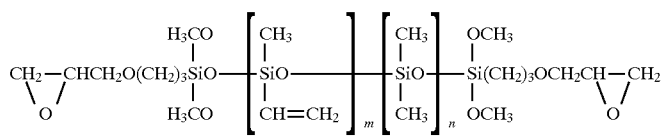

wherein m is a positive number and n is a positive number; an organopolysiloxane having the following formula:

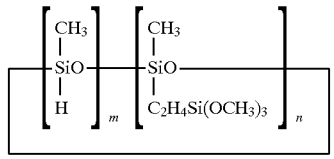

wherein m is a positive and n is a positive number, or an organopolysiloxane having the following formula:

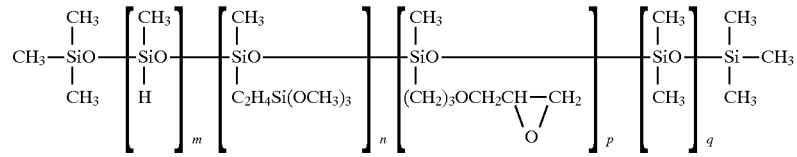

wherein m is a positive number, n is a positive number, p is a positive number, and q is 0 or a positive number. Such adhesion-promoting agents may be present in the amount ranging from 0.01–20 parts by weight with respect to 100 parts by weight of component (A) or component (A'). A range from 0.1–5 parts by weight is particularly preferred.

Moreover, examples of other optional components which may be mixed in with these electrically conductive silicone elastomer compositions include acetylene compounds such as 3-methyl-1-butyn-3-ol, 3,5-dimethyl-1-hexyn-3-ol, 3-phenyl-1-butyn-3-ol; enyne compounds such as 3-methyl-3-penten-1-yne and 3,5-dimethyl-3-hexen-1-yne; cycloalkenylsiloxanes such as 1,3,5,7-tetramethyl-1,3,5,7-tetravinylcyclotetrasiloxane and 1,3,5,7-tetramethyl-1,3,5,7-tetrahexenylcyclotetrasiloxane; triazole compounds such as benzotriazole; as well as addition reaction inhibitors such as phosphine compounds, mercaptan compounds, and hydrazine compounds. The amount of these addition reaction inhibitors in the mixture differs depending on the curing conditions, but generally speaking, it should be an amount such that this addition reaction inhibitor is contained in the amount of 10–1,000 ppm in units by weight with respect to the electrically conductive silicone elastomer composition.

Moreover, examples of other optional components which may be mixed in with these electrically conductive silicone elastomer compositions include inorganic fillers such as fumed silica, wet silica fine powder, quartz fine powder, calcium carbonate fine powder, titanium dioxide fine powder, diatomaceous earth fine powder, aluminum dioxide fine powder, aluminum hydroxide fine powder, zinc oxide fine powder, and zinc carbonate fine powder, and hydrophobic inorganic fillers in which these inorganic fillers are surface-treated with organoalkoxysilanea such as methyltrimethoxysilane, organohalosilanes such as trimethylchlorosilane, organosilanes such as hexamethyldisilane, or siloxane oligomers such as dimethylsiloxane oligomer having both terminals of the molecule terminated with hydroxyl groups, methylphenylsiloxane oligomer having both terminals of the molecule terminated with hydroxyl groups, and methylvinylsiloxane oligomer having both terminals of the molecule terminated with hydroxyl groups. Moreover, organic solvents such as toluene, xylene, acetone, methylethyl ketone, methylisobutyl ketone, hexane, heptane; non-cross-linking organopolysiloxanes such as polydimethylsiloxane having both terminals of the molecule terminated with trimethylsiloxy groups and polymethylphenylsiloxane having both terminals of the molecule terminated with trimethylsiloxy groups; as well as flame retardants, heat-resisting agents, plasticizers, thixotropic agents, adhesion-promoting agents, and antifungal agents.

Examples of high-energy beams used in order to induce the free radical reaction due to the acrylic functional group in the electrically conductive silicone elastomer composition of the present invention include visible light, ultraviolet rays, x-rays, and electron beams, with ultraviolet rays being preferred for practical use. In methods for irradiation with such ultraviolet rays,. light sources such as hydrogen discharge tubes, high-pressure mercury lamps, medium-pressure mercury lamps, low-pressure mercury lamps, metal halide lamps, xenon lamps, chemical lamps, and carbon-arc lamps should preferably be used. The wavelength of these ultraviolet rays should preferably be in the range of 250–400 nm. Concerning the conditions of irradiation with these ultraviolet rays, examples are the method of ultraviolet irradiation of the electrically conductive silicone elastomer composition under refrigeration, at room temperature, or under heating, and the method of irradiation in an inert gas atmosphere such as nitrogen gas or argon gas, in air, or in a vacuum. The total irradiation dose of the ultraviolet rays should preferably be 15 J/cm$^2$ or less at a wavelength of 250–400 nm. A range of 1–8 J/cm$^2$ is particularly preferred. The time of this irradiation with ultraviolet rays should preferably be immediately after application of the electrically conductive silicone elastomer composition to the substrate. The fact that this electrically conductive silicone elastomer composition has undergone an acrylic functional group free radical reaction due to high-energy beam irradiation is confirmed by an increase in viscosity, film formation, etc., on the surface of the electrically conductive silicone elastomer composition, but it is not necessarily accompanied by changes in external appearance.

Next, the temperature at which this electrically conductive silicone elastomer composition is cured due to the hydrosilylation reaction is preferably in the range of 50°–300° C. A range of 100°–250° C. is particularly preferred. Concerning the method for heating this electrically conductive silicone elastomer composition, the use of heating devices such as an infrared irradiation device, hot air circulation-type oven, or hot plate is preferred.

Concerning the hardness of the electrically conductive silicone elastomer obtained in this manner, its JIS A hardness as specified by JIS K 6301 should preferably be 20 or above, with a figure of 30–95 being particularly preferred.

The electrically conductive silicone elastomer composition of the present invention may be used as a die bonding agent for binding semiconductor chips to substrates, packages, etc. Once the semiconductor chip has been mounted on a substrate by means of this electrically conductive silicone elastomer, and the electrically conductive silicone elastomer composition has been irradiated with a high-energy beam which causes an acrylic functional group free radical reaction, it is possible to inhibit outgassing of low-molecular-weight silicone oil from the electrically conductive silicone elastomer composition prior to the hydrosilylation reaction or during curing due to the hydrosilylation reaction. The semiconductor chip, substrate, package, and lead frame are therefore not contaminated by this low-molecular-weight silicone oil, this offers the advantage that decreases in wire bondability to semiconductor chips, lead frames, etc. Furthermore, adhesion defects between semiconductor chips, substrates, packages, or lead frames and the sealing resin can be minimized or eliminated. In addition when these components, which have been adhered using the composition of the present invention are soldered or a conformal coating is applied to them, soldering defects, crawling of the coating, etc., do not occur. Moreover, there is the advantage that by using the electrically conductive silicone elastomer composition of the present invention as a die bonding agent, it is possible to manufacture semiconductor devices having outstanding reliability, such as moisture resistance, with favorable yields.

Next, the method for manufacturing semiconductor devices of the present invention and semiconductor devices obtained by this method will be explained in detail.

Figure 2:
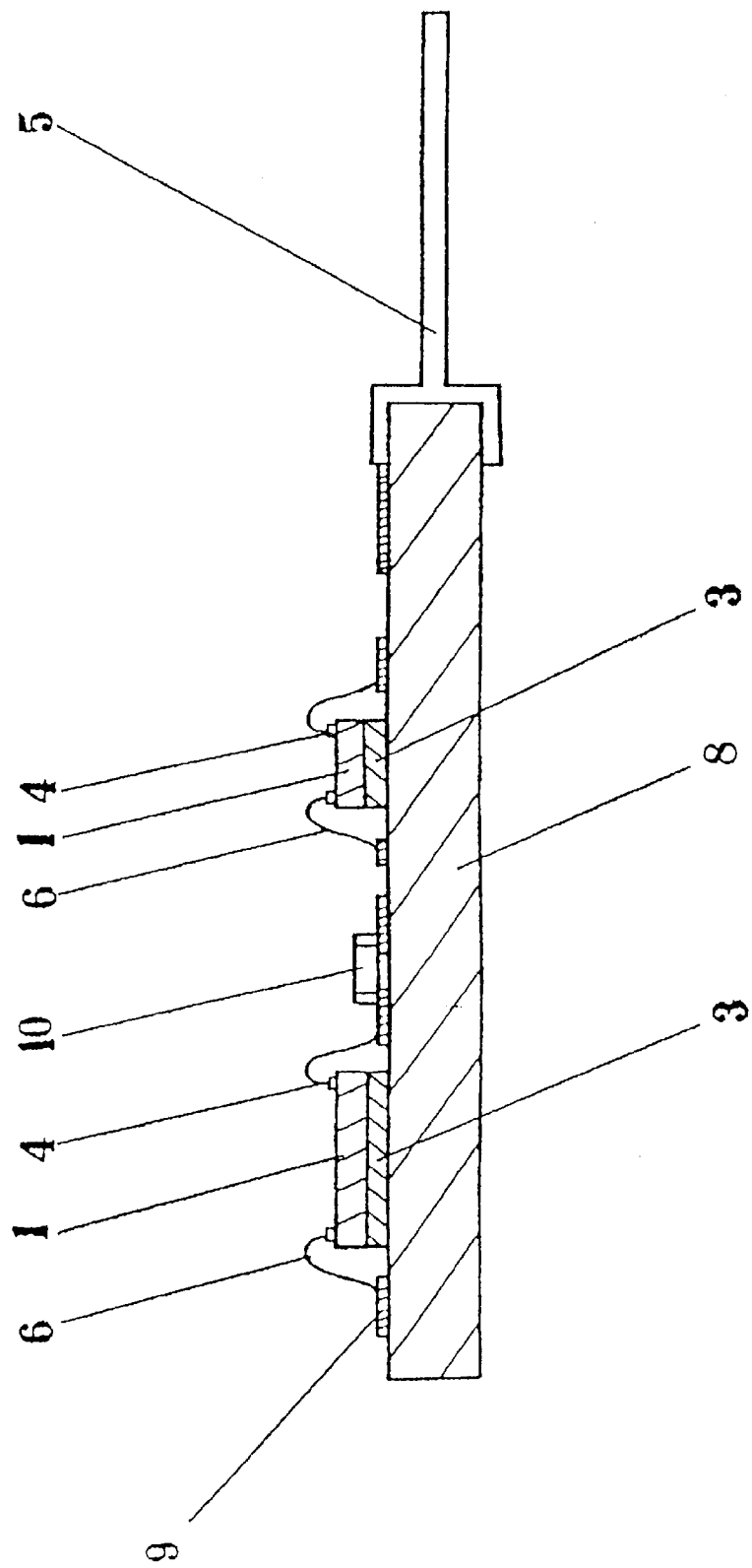
FIG. 2 is a sectional diagram of a semiconductor device according to the present invention.

Examples of semiconductor devices manufactured by the manufacturing method of the present invention include diodes, transistors, thyristors, monolithic ICs, hybrid ICs, LSIs, and VLSIs. Moreover, examples of semiconductor chips in semiconductor devices include diode chips, transistor chips, thyristor chips, monolithic IC chips, and semiconductor chips in hybrid ICs. For example, as shown in FIG. 1, a semiconductor device obtained by the manufacturing method of the present invention is characterized in that a semiconductor chip 1 and a tab 22 are adhered by means of an electrically conductive silicone elastomer composiiton which has been cured to form an electrically conductive silicone elastomer. (A tab which is a substrate upon which a semiconductor chip may be mounted.) Examples of raw materials of this tab 2 include copper and iron alloys. Moreover, as shown in FIG. 2, in a semiconductor device obtained by the manufacturing method of the present invention, a circuit board 8 composed of raw materials such as ceramics and glass may be used as the substrate for mounting the semiconductor chip 1. Circuit wiring 9 is formed on the surface of this circuit board 8 by means of metals such as gold, silver, and copper, and electrical components 10 such as capacitors, resistors, and coils may also be mounted on the surface of this circuit board 8.

In the manufacturing method for a semiconductor device of the present invention, after a semiconductor chip 1 and a tab 2 or a ceramic circuit board 8 are mounted by means of the aforementioned electrically conductive silicone elastomer composition, by irradiating this electrically conductive silicone elastomer composition with a high-energy beam, a free radical reaction of the acrylic functional group is induced. Examples of this high-energy beam include visible light, ultraviolet rays, x-rays, and electron beams, with ultraviolet rays being preferred for practical use. In methods for irradiation with.these ultraviolet rays, light sources such as hydrogen discharge tubes, high-pressure mercury lamps, medium-pressure mercury lamps, low-pressure mercury lamps, metal halide lamps, xenon lamps, chemical lamps, and carbon arc lamps should preferably be used. The wavelength of this ultraviolet radiation should preferably be in the range of 250–400 nm. Concerning the conditions of this ultraviolet ray irradiation, examples of methods are that of ultraviolet irradiation of the electrically conductive silicone elastomer composition under refrigeration, at room temperature, or under heating and the method of irradiation in an inert gas atmosphere such as nitrogen gas argon gas, in air, or in a vacuum. The total irradiation dosage of ultraviolet rays should preferably be 15 J/cm$^2$ or less at a wavelength of 250–400 nm. A range of 1–8 J/cm$^2$ is particularly preferred. Concerning the time of this ultraviolet irradiation, it should preferably be carried out immediately after mounting of the semiconductor chip 1 on the tab 2 or ceramic circuit board B.

Next, this electrically conductive silicone elastomer composition is cured by means of a hydrosilylation reaction and the semiconductor chip 1 is caused to adhere to the tab 2 or the ceramic circuit board 8. The temperature at which this hydrosilylation reaction is carried out should preferably be in the range of 50°–300° C. A range of 100°–250° C. is particularly preferred. Concerning the method of heating of this electrically conductive silicone elastomer composition, heating devices such as an infrared irradiation device, a hot-air circulation-type oven, or a hot plate should preferably be used.

After the electrically conductive silicone elastomer 3 has been formed in this manner by curing the electrically conductive silicone elastomer composition by means of a hydrosilylation reaction, wire bonding of the aluminum-bonding pad 4 installed at the upper edge of the semiconductor chip 1 and the metal lead frame 5 or copper circuit board 9 is carried out by means of gold bonding wire 6. In addition to gold, examples of this bonding wire include copper and aluminum. Examples of wire-bonding methods include the thermocompression bonding method, the ultrasonic bonding method, and the ultrasonic thermocompression. bonding method. Next, silicone elastomer or silicone gel may be formed on the surface of this semiconductor chip 1 in order to protect it. Moreover, as needed, the semiconductor device of the present invention may be formed by resin sealing of the semiconductor chip 1 by means of sealing resin 7. Examples of this sealing resin 7 are epoxy resin, phenol resin, and polyphenylene sulfide resin.

EXAMPLES

The electrically conductive silicone elastomer composition, method for manufacturing a semiconductor device, and semiconductor device of the present invention will be explained by means of practical examples. The viscosity values in the practical examples were measured at 25° C. Furthermore, in the practical examples, evaluation of the hardness and volume resistivity of the electrically conductive silicone elastomer obtained by curing the electrically conductive silicone elastomer composition, evaluation of the method for manufacturing semiconductor devices and the wire bondability of the semiconductor chips, lead frame, etc., evaluation of the moisture resistance of the semiconductor devices, and evaluation of the adhesion properties of the semiconductor chips and the sealing resin were carried out as follows.

Hardness of electrically conductive silicone elastomer: After carrying out ultraviolet irradiation of the electrically conductive silicone elastomer composition using a conveyor-type ultraviolet irradiation device (manufactured by Ushio Denki K.K.; UVC-2533/1MNLC3-AA08) by means of a 160 W/cm high-pressure mercury lamp to a total irradiation dosage of 5 J/cm$^2$, it was heated for 30 minutes at 150° C. to form electrically conductive silicone elastomer. The hardness of this electrically conductive silicone elastomer was measured using the JIS A hardness meter specified in JIS K 6301.

Volume resistivity of electrically conductive silicone elastomer: An electrically conductive silicone elastomer sheet 1 mm in thickness was formed by the above method. The volume resistivity of this electrically conductive silicone elastomer sheet was measured using a resistivity measurement device (model K-705RL manufactured by Kyowa Riken Ltd.).

Evaluation of manufacturing method of semiconductor device and wire bondability: The semiconductor device shown in FIG. 1 was prepared. This semiconductor device had 144 leads in its lead frame, and the size of the semiconductor chip was 10 mm×10 mm. This semiconductor chip 1 was mounted on the tab 2 by means of the electrically conductive silicone elastomer composition, this was irradiated with ultraviolet rays using a conveyor-type ultraviolet irradiation device (manufactured by Ushio K.K.; UVC-2533/1MNLC3-AA08) by means of a 160 W/cm high-pressure mercury lamp to a total irradiation dosage of 5 J/cm$^2$, and the surface of the electrically conductive silicone elastomer composition extruded on the periphery of the chip was caused to undergo an acrylic functional group free radical reaction. The composition was heated for 10 minutes at 150° C. to form electrically conductive silicone elastomer 3. Wire bonding of the aluminum bonding pad 4 installed on the upper edge of the semiconductor chip 1 and the gold lead frame 5 was then carried out using gold bonding wire 6, and the semiconductor device was formed. The wire bonding was carried out using the ultrasonic thermocompression bonding method (bonding temperature: 160°–250° C., load; 30–100 mg/unit. 20 of these semiconductor devices were prepared. Next, neck formation between the gold bonding wire 6 and the bonding pad 4 or copper lead frame 5 was observed under a microscope, and at this time, by stretching the gold bonding wire 6, the bonding status of this bonding wire 6 was observed, and this wire bondability was expressed as the rate of bonding defects of the bonding wire 6.

Evaluation of moisture resistance of semiconductor devices: Semiconductor device were prepared by resin sealing, using epoxy resin, of a semiconductor chip to which bonding wire 6 was favorably bonded. 20 of these semiconductor devices were heated for specified periods in saturated water vapor at 121° C. and 2 atmospheres. After heating, an electric current was applied to the semiconductors, and the leak current between the copper lead frame 4 was measured. Moreover, moisture resistance of the semiconductors was expressed as the rate of increase in leak current and defective semiconductor devices in which conduction was defective.

Evaluation of adhesion of semiconductor chips and sealing resin: After 20 semiconductor devices which had been resin-sealed using epoxy resin were left standing for 168 hours under conditions of 85° C. and 85% RH, they were heated using an IR reflow at 245° C. After heating, the semiconductor devices were observed using an ultrasonic microscope, and separation occurring between the semiconductor chip 1 and the epoxy resin sealing material was observed. The rate of occurrence of semiconductor devices showing this peeling was determined.

Example 1

100 parts by weight of an organopolysiloxane mixture composed of 23.5% by weight of a mixture of dimethylpolysiloxane having both terminals of the molecule terminated with 3-methacryloxypropyl dimethoxysiloxy groups and having a viscosity of 15,000 mPa.s and silicone resin composed of $(CH_3)_3SiO_{1/2}$, $CH_2$=$C(CH_3)COOC_3H_6$ $(CH_3O)_2SiO_{1/2}$, and $SiO_2$ units and 76.5% by weight of a mixture of dimethylsiloxane.methylvinylsiloxane copolymer having both terminals of the molecule terminated with dimethylvinylsiloxy groups and silicone resin composed of (CH$_3$)$_3$SiO$_{1/2}$, (CH$_2$=CH) (CH$_3$)$_2$SiO$_{1/2}$, and SiO$_2$ units (vinyl group content=0.9% by weight), 16 parts by weight of methylhydrogensiloxane.dimethylsiloxane copolymer having both terminals of the molecule terminated with hydrogensiloxy groups and having a viscosity of 30 mPa.s (amount of silicon-bonded hydrogen atoms=0.75% by weight), 17 parts by weight of organopolysiloxane having the following formula:

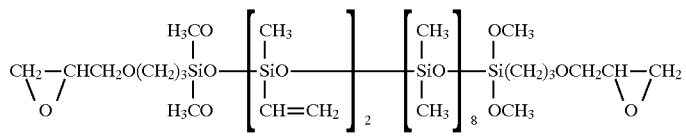

510 parts by weight of flake-type silver powder having an average particle diameter of 7 μm, 10 parts by weight of benzophenone as a photosensitizer, 7 parts by weight of hydrophobic fumed silica which had been surface-treated with hexamethyldisilazane and having a specific surface area of 200 m$^2$/g, a 1,1,3,3-tetramethyl-1,3-divinyldisiloxane complex of platinum (in an amount such that the platinum metal content in the composition of the present invention is 15 ppm in units by weight), and 3-phenyl-1,butyn-3-ol (in an amount such that the content in the composition of the present invention is 350 ppm in units by weight) were uniformly mixed to prepare an electrically conductive silicone elastomer composition. Semiconductor devices were prepared using this electrically conductive silicone elastomer composition. The results of evaluation thereof are shown in Table 1.

Example 2

100 parts by weight of an organopolysiloxane mixture composed of 22.5% by weight of a mixture of dimethylpolysiloxane having both terminals of the molecule terminated with 3-methacryloxypropyl dimethoxysiloxy groups and having a viscosity of 15,000 mPa.s and silicone resin composed of (CH$_3$)$_3$SiO$_{1/2}$, CH$_2$=C(CH$_3$)COOC$_3$H$_6$(CH$_3$O)$_2$SiO$_{1/2}$, and SiO$_2$ units and 77.5% by weight of a mixture of dimethylsiloxane.methylvinylsiloxane copolymer having both terminals of the molecule terminated with dimethylvinylsiloxy groups and silicone resin composed of (CH$_3$)$_3$SiO$_{1/2}$, (CH$_2$=CH) (CH$_3$)$_2$SiO$_{1/2}$, and SiO$_2$ units (vinyl group content=0.9% by weight), 16 parts by weight of methylhydrogensiloxane.dimethylsiloxane copolymer having both terminals of the molecule terminated with hydrogensiloxy groups and having a viscosity of 30 mPa.s (amount of silicon-bonded hydrogen atoms=0.75% by weight), 17 parts by weight of organopolysiloxane having the following formula:

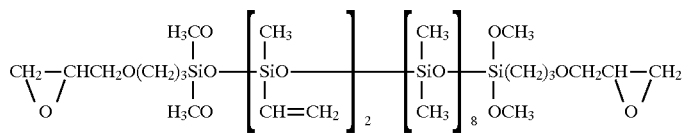

510 parts by weight of flake-type silver powder having an average particle diameter of 5 μm, 9 parts by weight of 2-hydroxy-2-methyl-1-phenylpropan-1-one as a photosensitizer, 3 parts by weight of hydrophobic fumed silica which had been surface-treated with hexamethyldisilazane and having a specific surface area of 200 m$^2$/g, a 1,1,3,3-tetramethyl-1,3-divinyldisiloxane complex of platinum (in an amount such that the platinum metal content in the composition of the present invention is 15 ppm in units by weight), and 3-phenyl-1,butyn-3-ol (in an amount such that the content in the composition of the present invention is 350 ppm in units by weight) were uniformly mixed to prepare an electrically conductive silicone elastomer composition. Semiconductor devices were prepared using this electrically conductive silicone elastomer composition. The results of evaluation thereof are shown in Table 1.

Example 3

100 parts by weight of organopolysiloxane composed of (CH$_3$)$_3$SiO$_{1/2}$, CH$_2$=C(CH$_3$)COOC$_3$H$_6$(CH$_3$O)$_2$SiO$_{1/2}$, (CH$_2$=CH) (CH$_3$)$_2$SiO$_{1/2}$, and SiO$_2$ units (vinyl group content=1.0% by weight), 18 parts by weight of methylhydrogensiloxane.dimethylvinylsiloxane copolymer having both terminals of the molecule terminated with dimethylhydrogensiloxy groups having a viscosity of 30 mPa.s (amount of hydrogen atoms bound to silicon atoms=0.75% by weight), 17 parts by weight of organopolysiloxane having the following formula:

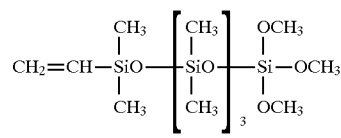

650 parts by weight of flake-type silver powder having an average particle diameter of 5 μm, 9 parts by weight of a mixture of benzophenone and 2-hydroxy-2-methyl-1-phenylpropan-1-one in a weight ration of 1:1 as a photosensitizer, 3 parts by weight of hydrophobic fumed silica which had been surface-treated with hexamethyldisilazane and having a specific surface area of 200 m$^2$/g, a 1,1,3,3-tetramethyl-1,3-divinyldisiloxane complex of platinum (in an amount such that the platinum metal content in the composition of the present invention is 15 ppm in units by weight), and 3-phenyl-1,butyn-3-ol (in an amount such that the content in the composition of the present invention is 350 ppm in units by weight) were uniformly mixed to prepare an electrically conductive silicone elastomer composition. Semiconductor devices were prepared using this electrically conductive silicone elastomer composition. The results of evaluation thereof are shown in Table 1.

Comparison Example 1

100 parts by weight of dimethylpolysiloxane having both terminals of the molecule terminated with dimethylhyvinylsiloxy groups having a viscosity of 2,000 mPa.s (vinyl group content=0.2% by weight), 2.5 parts by weight of methylhydrogenpolylsiloxane having both terminals of the molecule terminated with trimethylsiloxy groups having a viscosity of 20 mPa.s (amount of hydrogen atoms bound to silicon atoms=1.5% by weight), 8 parts by weight of organopolysiloxane having the following formula:

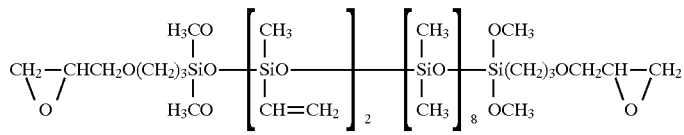

480 parts by weight of flake-type silver powder having an average particle diameter of 5 μm, 9 parts by weight of hydrophobic fumed silica which had been surface-treated with hexamethyldisilazane and having a specific surface area of 200 m²/g, a 1,1,3,3-tetramethyl-1,3-divinyldisiloxane complex of platinum (in an amount such that the platinum metal content in the composition of the present invention is 15 ppm in units by weight), and 3-phenyl-1,butyn-3-ol (in an amount such that the content in the composition of the present invention is 350 ppm in units by weight) were uniformly mixed to prepare an electrically conductive silicone elastomer composition. Semiconductor devices were prepared using this electrically conductive silicone elastomer composition. The results of evaluation thereof are shown in Table 1.

Comparison Example 2

Using the electrically conductive silicone elastomer composition prepared in Comparison Example 1, semiconductor devices were prepared in the same manner as in Comparison Example 1, except for the fact that ultraviolet irradiation was not carried out. The results of evaluation thereof are shown in Table 1.

Comparison Example 3

Using the electrically conductive silicone elastomer composition prepared in Example 1, semiconductor devices were prepared in the same manner as in Practical Example 1, except for the fact that ultraviolet irradiation was not carried out. The results of evaluation thereof are shown in Table 1.

TABLE 1

|  | Practical examples | | | Comparison examples | | |
| --- | --- | --- | --- | --- | --- | --- |
|  | Example 1 | Example 2 | Example 3 | Comparison Example 1 | Comparison Example 2 | Comparison Example 3 |
| Electrically silicone elastomer |  |  |  |  |  |  |
| Hardness (JIS-A) | 85 | 80 | 80 | 80 | 80 | 83 |
| Vol. resistivity (Ω · cm) | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ |
| Rate of occurr. of wire bonding defects | 0/2880 | 0/2880 | 0/2880 | 205/2880 | 280/2880 | 300/2880 |
| Rate of occurr. of moisture res. defects |  |  |  |  |  |  |
| After 48 hours | 0/20 | 0/20 | 0/20 | 2/20 | 5/20 | 8/20 |
| After 168 hours | 0/20 | 0/20 | 0/20 | 6/18 | 8/15 | 8/12 |
| After 504 hours | 0/20 | 0/20 | 0/20 | 12/12 | 7/7 | 4/4 |
| Rate of sep. from sealing resin | 0/20 | 0/20 | 0/20 | 15/20 | 16/20 | 16/20 |

The electrically conductive silicone elastomer composition of the present invention is characterized in that a silicone elastomer having outstanding electrical conductivity can be formed by curing without contamination of the periphery of the electrically conductive silicone elastomer composition by low-molecular-weight silicone oil before during curing via the hydrosilylation reaction. Moreover, the manufacturing method for semiconductor devices of the present invention is characterized by the fact that at the time of adhesion of the semiconductor chip to the substrate, package, etc., by means of this electrically conductive silicone elastomer composition, decreases in wire bondability of the semiconductor chip or lead frame and adhesion defects between the semiconductor chip, substrate, package, or lead frame and the sealing resin can be inhibited. Moreover, the semiconductor device of the present invention is characterized in that because it is manufactured by this manufacturing method, it has outstanding reliability.

That which is claimed is:

1. An electrically conductive silicone elastomer composition, comprising:
    (A) 100 parts by weight of an organopolysiloxane consisting essentially of
        (a) 5–95% by weight of an acrylic functional group-containing organopolysiloxane having an average of at least two silicon-bonded acrylic groups per molecule having the formula:

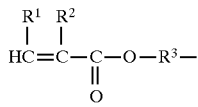

wherein $R^1$ is a hydrogen atom or a monovalent hydrocarbon group, $R^2$ is a hydrogen atom or a monovalent hydrocarbon group, and $R^3$ is a divalent hydrocarbon group having 1–10 carbon atoms; and (b) 95–5% by weight of an alkenyl group-containing organopolysiloxane having an average of at least two silicon-bonded alkenyl groups per molecule;

(B) a silicon-bonded hydrogen atom-containing organopolysiloxane having an average of at least two silicon-bonded hydrogen atoms per molecule, in a quanity sufficient to provide 0.5 to 20 moles of silicon-bonded hydrogen atoms in component (B) per mole of silicon-bonded alkenyl group in component (b);

(C) 50–2,000 parts by weight of an electrically conductive filler;

(D) 0.1–20 parts by weight of a photosensitizer; and (E) a platinum catalyst, in a sufficient quantity to cure the electrically conductive silicone elastomer composition.

2. An electrically conductive silicone elastomer composition, comprising (A') 100 parts by weight of an alkenyl group-containing organopolysiloxane having an average of at least two silicon-bonded alkenyl groups per molecule;

(B') a silicon bonded hydrogen atom-containing organopolysiloxane having an average of at least two silicon-bonded hydrogen atoms per molecule; in an amount sufficient to provide 0.5–20 moles of silicon-bonded hydrogen atoms in component (B') per mole of silicon-bonded alkenyl group in component (A');

(C) 50–2,000 parts by weight of an electrically conductive filler;

(D) 0.1–20 parts by weight of a photosensitizer; and (E) a platinum catalyst, in an amount sufficient to cure the electrically conductive silicone elastomer composition;

wherein at least one component selected from components (A') or (B') contains an average of at least two silicon-bonded acrylic groups per molecule having the formula

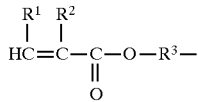

wherein $R^1$ is a hydrogen atom or a monovalent hydrocarbon group, $R^2$ is a hydrogen atom or a monovalent hydrocarbon group, and $R^3$ is a divalent hydrocarbon group having 1–10 carbon atoms.

3. A product obtained from incipient materials:

(A) 100 parts by weight of an organopolysiloxane consisting essentially of (a) 5–95% by weight of an acrylic functional group-containing organopolysiloxane having an average of at least two silicon-bonded acrylic groups per molecule having the formula:

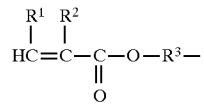

wherein $R^1$ is a hydrogen atom or a monovalent hydrocarbon group, $R^2$ is a hydrogen atom or a monovalent hydrocarbon group, and $R^3$ is a divalent hydrocarbon group having 1–10 carbon atoms; and (b) 95–5% by weight of an alkenyl group-containing organopolysiloxane having an average of at least two silicon-bonded alkenyl groups per molecule;

(B) a silicon-bonded hydrogen atom-containing organopolysiloxane having an average of at least two silicon-bonded hydrogen atoms per molecule, in a quanity sufficient to provide 0.5 to 20 moles of silicon-bonded hydrogen atoms in component (B) per mole of silicon-bonded alkenyl group in component (b);

(C) 50–2,000 parts by weight of an electrically conductive filler;

(D) 0.1–20 parts by weight of a photosensitizer; and (E) a platinum catalyst, in a sufficient quantity to cure the product.

4. A product obtained from incipient materials:

(A') 100 parts by weight of an alkenyl group-containing organopolysiloxane having an averaage of at least two silicon-bonded alkenyl groups per molecule;

(B') a silicon bonded hydrogen atom-containing organopolysiloxane having an average of at least two silicon-bonded hydrogen atoms per molecule; in an amount sufficient to provide 0.5–20 moles of silicon-bonded hydrogen atoms in component (B') per mole of silicon-bonded alkenyl group in component (A');

(C) 50–2,000 parts by weight of an electrically conductive filler;

(D) 0.1–20 parts by weight of a photosensitizer; and (E) a platinum catalyst, in an amount sufficient to cure the product;

wherein at least one component selected from components (A') or (B') contains an average of at least two silicon-bonded acrylic groups per molecule having the formula

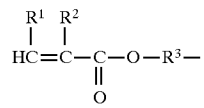

wherein $R^1$ is a hydrogen atom or a monovalent hydrocarbon group, R is a hydrogen atom or a monovalent hydrocarbon group, and $R^3$ is a divalent hydrocarbon group having 1–10 carbon atoms.

* * * * *